United States Patent [19]
Akitake et al.

[11] Patent Number: 5,441,804
[45] Date of Patent: Aug. 15, 1995

[54] MAGNETO-OPTICAL RECORDING MEDIUM AND METHOD FOR PRODUCTION THEREOF

[75] Inventors: Toshiyuki Akitake; Shingetsu Yamada, both of Hiratsuka, Japan

[73] Assignee: Mitsubishi Plastics Industries Limited, Tokyo, Japan

[21] Appl. No.: 285,516

[22] Filed: Aug. 4, 1994

Related U.S. Application Data

[63] Continuation-in-part of Ser. No. 26,194, Feb. 26, 1993, abandoned, which is a continuation of Ser. No. 654,011, Feb. 12, 1991, abandoned.

[51] Int. Cl.⁶ .............................................. B05D 5/12
[52] U.S. Cl. .................... 428/336; 204/192.2; 204/192.26; 427/128; 427/131; 427/132; 427/162; 428/447; 428/621; 428/622; 428/623; 428/626; 428/670; 428/678; 428/681; 428/687; 428/693; 428/694 T; 428/697; 428/699; 428/900; 428/928
[58] Field of Search ............... 427/162, 131, 128, 132; 428/928, 621, 622, 623, 626, 670, 678, 681, 687, 336, 447, 693, 694, 697, 699, 900; 704/192.26, 192.2

[56] References Cited

U.S. PATENT DOCUMENTS 4,670,353 6/1987 Sakurai .

FOREIGN PATENT DOCUMENTS 0279581 8/1988 European Pat. Off. .
0304893 3/1989 European Pat. Off. .
1-18506 6/1989 Japan .

OTHER PUBLICATIONS

Patent Abstracts of Japan–Laying Open Number 59-84358, now JP1-18506 (no date).
Patent Abstracts of Japan–Laying Open Number 1-18506 (no date).
Sep. 13, 1994 Communication from the European Patent Office in EPA 91 102 099.8.
Toki et al., "Sputtered Tb/FeCoTi Multilayered Films for Magneto-Optical Recording", Digests of International Magnetics Conference, Apr. 1990, Brighton, U.K.. Introduction, Experiment, Results and discussion.
Patent Abstracts of Japan, vol. 8, No. 202, (P-300) (1639) Sep. 14, 1984, JP-A-59-84358, Abstract, Yahagi, Photomagnetic Recording Medium, May 1984.

*Primary Examiner*—Bernard Pianalto
*Attorney, Agent, or Firm*—Finnegan, Henderson, Farabow, Garrett & Dunner

[57] ABSTRACT

A magneto-optical recording medium has on the substrate a recording layer made of a multi-layered metallic thin film comprising a first unit layer and a second unit layer. The first unit layer is composed of $(Fe_xCo_{1-x})_{1-y}M_y$ where M represents at least one metal selected from the group consisting of Pt, Pd and Au, $0.5 \leq X \leq 1.0$, and $0.01 \leq y \leq 0.1$. The second unit layer is composed of a% least one metal selected from the group consisting of Nd, Dy, Gd and Tb. The first and second unit layers are superimposed alternately one on another.

13 Claims, 3 Drawing Sheets

MAGNETO-OPTICAL RECORDING MEDIUM AND METHOD FOR PRODUCTION THEREOF

This application is a continuation-in-part application of U.S. Pat. application Ser. No. 08/026,194, filed Feb. 26, 1993, which is a continuation of U.S. Pat. application Ser. No. 07/654,011, filed Feb. 12, 1991 and now abandoned.

BACKGROUND OF THE INVENTION

1. Field of the Invention

The present invention relates to a magneto-optical recording medium which can be used in optical disks, optical cards and the like and in which information can be recorded on and/or from which the recorded information can be read out making use of laser beams. More particularly, the present invention relates to a magneto-optical recording medium having an excellent reproduction property and preventing deterioration of the recording film, and a method for producing such magneto-optical recording medium.

2. Description of the Prior Art

The magneto-optical memory has received much attention as a memory on which a large amount of information can record can be recorded in a high density and from which the information can be read out in a high speed. A magneto-optical recording medium for such a magneto-optical memory as described above has a recording layer which is provided with a magnetic film of a rare earth-transient metal amorphous alloy with vertical magnetization such as TbFeCo alloy disclosed in, for example, U.S. Pat. No. 4,670,353. Japanese Patent Publication No. 18506/1989 describes that the use of TbFeCoPt films as a recording layer can prevent the deterioration of the recording layer and improve the reproduction characteristics. Also, it has been proposed to add aluminum or titanium to the rare earth-transient metal alloy recording layer for the same purpose.

However, the above-described additional metals have been added uniformly in the recording layer and no sufficient effects could be obtained in both improvement of reproduction characteristics and prevention of deterioration.

SUMMARY OF THE INVENTION

It is an object of the present invention to solve the above-described defects of the prior art and provide a magneto-optical recording medium having excellent reproduction characteristics and a high reliability.

It is another object of the present invention to provide a method for producing such magneto-optical recording medium.

In the first aspect of the present invention, a magneto-optical recording medium comprises:
  a transparent substrate; and
  a recording layer formed on the substrate;
    wherein the recording layer is a multi-layered metallic thin film comprising a first unit layer composed of $(Fe_xCo_{1-x})_{1-y}M_y$ where M represents at least one metal Pt, Pd or Au, $0.5 \leq X \leq 1.0$, and $0.01 \leq y \leq 0.1$, and a second unit layer composed of at least one metal selected from the group consisting of Nd, Dy, Gd and Tb, and the first unit layer and the second unit layer being superimposed alternately one on another.

Here, the first unit layer may have a thickness of 1 to 4 atomic layers and the second unit layer may have a thickness of 0.5 to 2 atomic layers, and respective 20 to 300 layers of the first and second unit layers may be superimposed alternately one on another.

The magneto-optical recording medium may further comprise a dielectric thin film formed between the substrate and the recording layer.

The magneto-optical recording medium may further comprise another dielectric thin film formed on the recording layer.

In the second aspect of the present invention, an magneto-optical recording medium comprises:
  a first recording medium including:
    a first transparent substrate;
    a first lower dielectric layer formed on the first transparent substrate;
    a first recording layer composed of a multi-layered metallic thin film formed on the first lower dielectric layer and including a first unit layer composed of $(Fe_xCo_{1-x})_{1-y}M_y$ where M represents at least one metal Pt, Pd or Au, $0.5 \leq X 1.0$, and $0.01 \leq y \leq 0.1$, and a second unit layer composed of at least one metal selected from the group consisting of Nd, Dy, Gd and Tb, and the first unit layer and the second unit layer being superimposed alternately one on another;
    a first upper dielectric layer formed on the first recording layer; and
    a first protective layer formed on the first upper dielectric layer; and
  a second recording medium including:
    a second transparent substrate;
    a second lower dielectric layer formed the second transparent substrate;
    a second recording layer composed of a multi-layered metallic thin film formed on the second lower dielectric layer and including a third unit layer composed of $(Fe_xCo_{1-x})_{1-y}M_y$ where M represents at least one metal Pt, Pd or Au, $0.5 \leq X \leq 1.0$, and $0.01 \leq y \leq 0.1$, and a fourth unit layer composed of at least one metal selected from the group consisting of Nd, Dy, Gd and Tb, and the third unit layer and the fourth unit layer being superimposed alternately one on another;
    a second upper dielectric layer formed on the second recording layer; and
    a second protective layer formed on the second upper dielectric layer;
  the first and second recording media being bonded to each other in such a manner that the first and second protective layers face one another.

In the third aspect of the present invention, a magneto-optical recording medium comprises:
  a transparent substrate;
  a recording layer formed on the substrate;
  a dielectric thin film formed between the substrate and the recording layer; and
  another dielectric thin film formed on the recording layer;
    wherein the recording layer is a multi-layered metallic thin film comprising a first unit layer composed of $(Fe_xCo_{1-x})_{1-y}M_y$ wherein H is at least one metal selected from the group consisting of Pt, Pd and Au, $0.5 \leq X \leq 1.0$, and $0.01 \leq y \leq 0.1$, and having a thickness of 1 to 4 atomic layers and a second unit layer composed of at least one metal selected from the group consisting of Nd, Dy, Gd and Tb, and having a thickness of 0.5 to 2 atomic layers, and wherein 20 to 30 layers of the first and second unit layers are superimposed alternately one on another.

In the fourth aspect of the present invention, a method for producing a magneto-optical recording medium comprises steps of:

forming a buffer layer on a substrate;

sputtering a first target made of Tb and a second target consisting essentially of FeCo and at least one metal selected from the group consisting of Pt, Pd and Au, while revolving the substrate so that the substrate confronts the first target and the second target alternately thereby forming a multi-layered recording layer comprising a first unit layer composed of $(Fe_xCo_{1-x})_{1-y}M_y$ wherein M is at least one metal selected from the group consisting of Pt, Pd or An, $0.5 \leq x \leq 1.0$, and $0.01 \ y \leq 0.1$, and having a thickness of 1 to 4 atomic layers and a second unit layer composed of at least one metal selected from the group consisting of Nd, Dy, Gd or Tb, and having a thickness of 0.5 to 2 atomic layers.

Here, the second target may be made of a FeCo alloy and a chip of at least one metal Pt, Pd or Au may be mounted on the second target.

Here, the second target may be made of a FeCoPt alloy, FeCoPd alloy or FeCoAu alloy.

Here, 20 to 30 layers of the first and second unit layers may be superimposed alternately one on another.

Here, the method may further comprise the step of stopping the revolving motion of the substrate during a predetermined time when the substrate is positioned at a position that the substrate confronts any one of the first target and the second target.

The method may further comprise the step of opening a shutter provided on a surface of the substrate in synchronization with the stopping of the revolving motion of the substrate.

DETAILED DESCRIPTION OF PREFERRED EMBODIMENTS

In the present invention, a recording layer is composed of a plurality of transient metal layers and a plurality of rear earth metal layers, and platinum (Pt), palladium (Pd) or gold (An) is added into the transient metal layers that is in the vicinity of the transient metal atoms but does not exist near rare earth metal atoms except for the interfaces of the layers.

Hereafter, the invention will be explained in more detail taking Tb as a representative of the rare earth metal including Nd, Dy, Gd, Tb and the like and Fe and Co as representatives of the transient metal.

As a result of various experiments conducted by the present inventors, it has revealed that additional elements to be added in order to improve corrosion resistance, particularly Pt, Pd and An, do not exhibit their function sufficiently when they exist near Tb due to their mechanism of corrosion resistance. In the case of Ti and Al, as soon as the occurrence of pitting corrosion starts oxide is produced to form a passive state which prevents the pitting corrosion from proceeding further. On the other hand, Pt, Pd and Au have an effect of inhibiting the formation of pinhole-generating nuclei and an effect of condensing metals such as Pt upon the occurrence of pitting corrosion. To date, it has been considered that once pitting corrosion occurs these metals are poor in the effect of improving durability as compared with Ti. However, the present inventors have found that when Tb and FeCo alloy are sputtered separately to form a multi-layer structure and add Pt or the like to the resulting FeCo alloy layer alone, the durability can be improved as compared with the cases where Pt or the like is added to the whole TbFeCo alloy, where Ti or Al is added to the whole TbFeCo alloy and where Ti or Al is added near FeCo alone, thus completing the present invention.

Example 1

Figure 1:
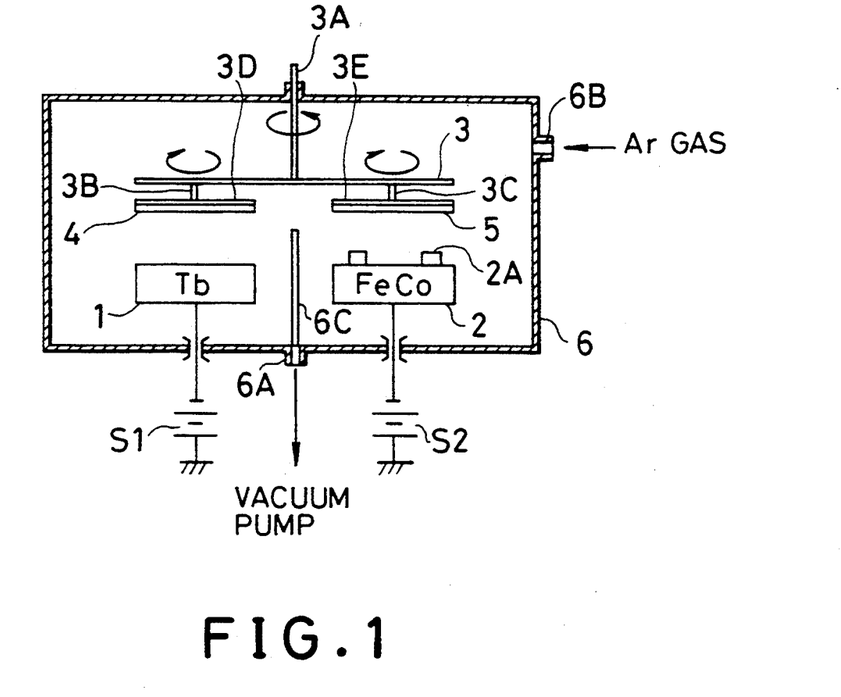
FIG. 1 is a schematic cross-sectional view showing an example of a sputtering apparatus used for the production of the magneto-optical recording medium of the present invention.

A magneto-optical recording medium was prepared using a sputtering apparatus as illustrated in FIG. 1.

The sputtering apparatus can fit therein a plurality of targets and in this embodiment two targets, i.e., targets 1 and 2 are indicated as being fitted. A holder carrier 3 which can rotate around a rotary shaft 3A has rotary shafts 3B and 3C to which substrate holders 3D and 3E, respectively, are attached rotatably. The substrate holders 3D and 3E support thereon substrates 4 and 5, respectively, so that the substrates can face the respective targets. For simplify the drawing, a mechanism which transmits power for rotation to each shaft is omitted in the drawing. The targets and the substrate holders are housed in a chamber 6 and air in the chamber can be exhausted by a vacuum pump (not shown) through an exhaust port 6A to establish high vacuum and then a predetermined gas, for example argon can be introduced in the chamber through gas inlet 6B. It is desirable to provide a partition wall 6C between the targets 1 and 2. Negative d.c. voltage is applied to the targets 1 and 2 from d.c. power sources S1 and S2, respectively. On the other hand, the chamber 6 is kept at ground voltage. When discharge is performed in the chamber 6 while rotating the substrate holders, the surfaces of the targets 1 and 2 are sputtered. When the substrates 4 and 5 are positioned above the targets 1 and 2, respectively, the substances constituting the corresponding targets, respectively, are deposited on the respective substrates. Therefore, if different substances are used for the targets 1 and 2, the different substances deposit on the substrates so that they are superimposed alternately one on another.

On this occasion, a magnet may be arranged on backside of each target to effect magnetron sputtering, or high frequency power may be applied to between the targets and the chamber to carry out deposition by high frequency sputtering. Further, a shutter may be provided on the lower portion of each substrate and the rotation of the rotary shaft 3A may be stopped at a timing when the substrate is positioned just above the target, and in synchronization therewith the shutter may be opened for a predetermined time to allow the substance constituting the target to be deposited on the substrate. By repeating this procedure, a film having a predetermined thickness can be formed on the substrate.

Figure 2:
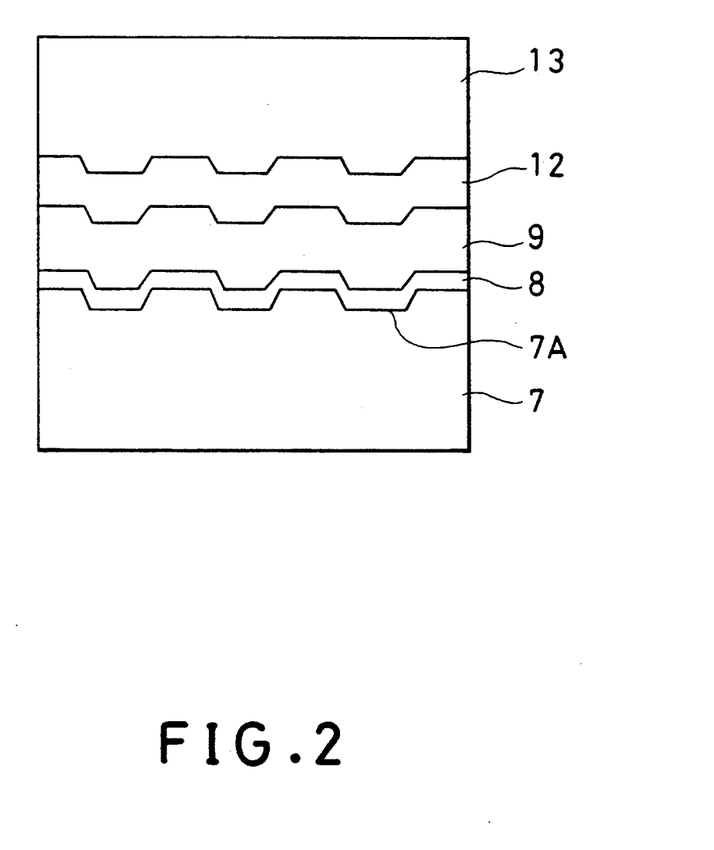
FIG. 2 is a schematic cross-sectional view showing an embodiment of the magneto-optical recording medium according to the present invention.

FIG. 2 is a schematic cross-sectional view showing an embodiment of the magneto-optical recording medium according to the present invention prepared using the apparatus illustrated in FIG. 1.

Figure 3:
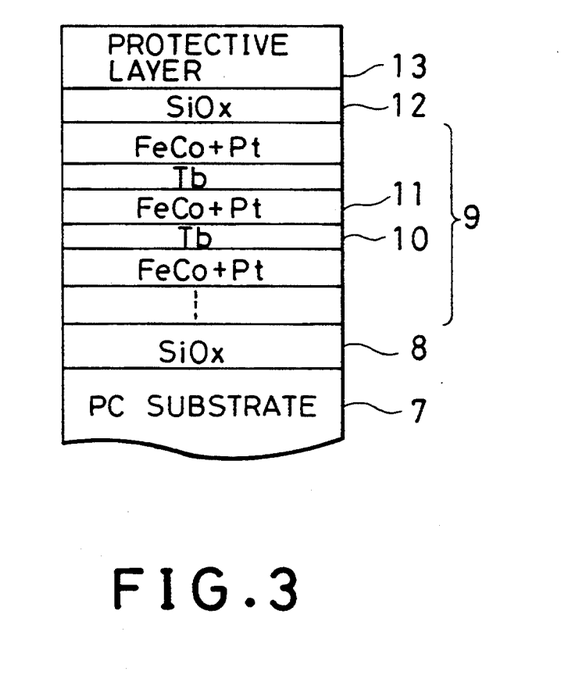
FIG. 3 is a schematic cross-sectional view for explaining the structure of the multi-layered recording layer.

As illustrated in FIG. 2, the magneto-optical recording medium of the present invention includes a transparent substrate 7 on which an SiO film as a dielectric layer 8, a recording layer 9, an SiO protective layer 12 and a resin protective layer 13 are formed in this order. As shown in FIG. 3, the recording layer 9 is composed of repeated laminates of Tb layer 10 and FeCo+Pt layer 11.

A polycarbonate substrate 7 having a diameter of 130 mm and provided with a spiral groove 7A having a width of 0.6 μm, a depth of 700Å and a pitch of 1.6 μm was attached to each of the substrate holders 3D and 3E. After exhausting air from inside the chamber to $10^{-7}$ Torr, argon gas was introduced in the chamber and sputtering was performed using SiO as a target to form an SiO film 8 on the substrate having a thickness of 800Å as a buffer layer. Using a Tb target as the target 1 and an FeCo alloy target on which Pt chips 2A were mounted as the target 2, the both targets were sputtered simultaneously, while the substrates were turning around their own axes and at the same time revolving around the rotary shaft 3A at 30 rpm. Thus, on each substrate was formed a recording layer composed of a Tb layer and an FeCo-Pt layer 11 alternately superimposed one on another. The thickness of a single Tb layer was 4.0Å (1.1 atomic layer), and that of a single FeCo-Pt layer was 5.3Å (2.1 atomic layer). By superimposing the two superimposition units 55 times, the recording layer 9 was made to have a film thickness of 800Å.

The deposition rates of the Tb layer and FeCo-Pt layer on the substrates are determined depending on the conditions of sputtering, mainly on the sputtering power, the pressure of argon gas and the revolving speed of the targets. Therefore, if deposition rates are obtained in advance from thicknesses of films formed performing sputtering under predetermined conditions for a predetermined time, the thickness of the deposited layer can be controlled by controlling the deposition time. To note, measurement of film thickness on the order of nanometer (nm) is possible by using a recently available thin film thickness meter with a diamond needle (for example, DEKTAK 3030 made by SLOAN). The number of atomic layers can be calculated from the thicknesses of the respective deposited layers, taking the thickness of a single atomic layer as 3.5Å in the case of the Tb layer or 2.5Å in the case of the FeCo-Pt layer.

The alloy composition of the target 2 and area ratio of the both targets were adjusted so that the composition of Tb, Fe and Co was $Tb_{24}Fe_{63}Co_{13}$, and the area of the Pt chip was determined so that the amount of Pt in the recording layer was 9.5 at. %. The pressure of argon gas at the time of sputtering was 5 mTorr, and powers applied to the Tb target and FeCo-Pt target were 300 W and 700 W, respectively. Then, after forming an SiO protective layer 12 to a thickness of 800Å, an ultraviolet ray-curing resin 13 was coated thereon to a thickness of 20 μm using a spin coater, and cured with ultraviolet rays to prepare a magneto-optical recording medium. The conditions of sputtering are not limited to those used in the above embodiment, but films can be formed stably under the conditions of an argon gas pressure of 1 to 8 mTorr (argon flow rate: 50 to 100 SCCM), a sputtering power of 100 to 5,000 W, and the target revolution rate can be increased up to 100 rpm.

Figure 4:
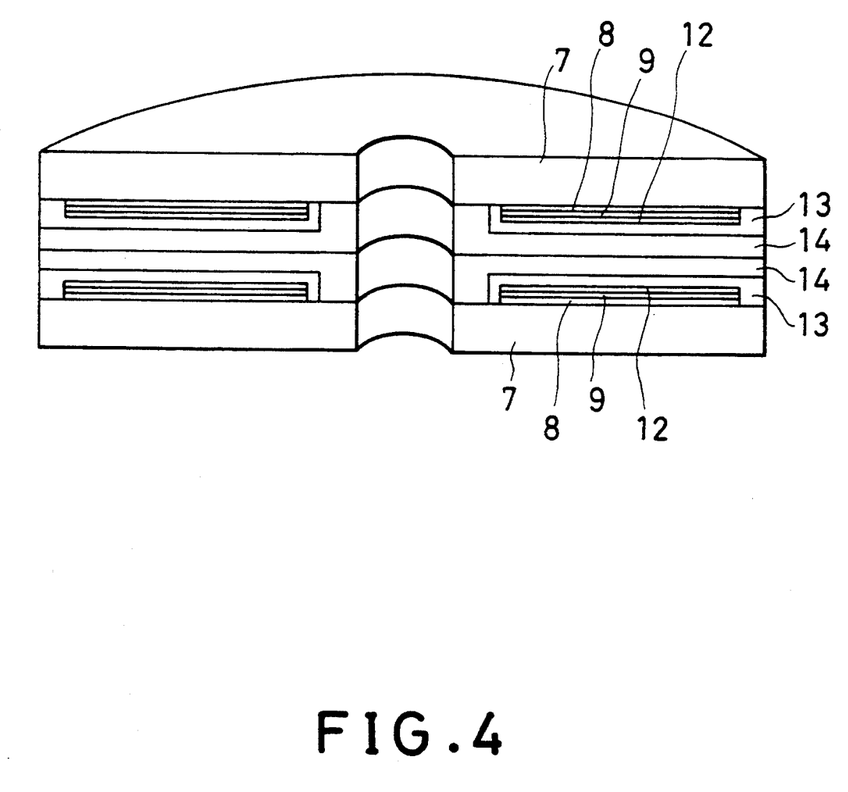
FIG. 4 is a partially cutaway view in perspective showing another embodiment of the magneto-recording medium according to the present invention.

As shown in FIG. 4, after coating a hot melt adhesive 14 on the respective resin protective layers 13 of the two recording media thus prepared using a roll coater to a thickness of 50 μm, the recording media were bonded to each other so that the surfaces coated with the adhesive can face one another to obtain a double sided disk having a diameter of 130 mm, which was named Example Sample 1.

The above procedures were repeated except that the additional element Pt was replaced by Pd and Au, respectively, to prepare double sided disks, which were named Example Samples 2 and 3, respectively.

An optical disk was prepared in the same manner as Example Sample 1 except that only one type of target, i.e., TbFeCo alloy on which Ti chip had been mounted, was used as the target for forming the recording layer and that Ti was added uniformly in the recording layer. This was named Comparative Sample 1. Similarly, Comparative Samples 2, 3, 4 and 5 were prepared by uniformly adding Al, Pt, Pd and Au, respectively, to the respective recording layers. Further, optical disks were prepared in the same manner as Example Sample 1 except that Ti and Al, respectively, were mounted on the FeCo alloy chip instead of Pt and recording layers of a multi-layer structure were formed. These optical disks were named Comparative Samples 6 and 7, respectively. The state of superimposition of the recording layer was all the same for Example Samples 2 and 3 and Comparative Samples 6 and 7 except that different additional elements were added to different samples.

For each sample, signals of 2 MHz were recorded starting from a position of 30 mm in diameter and initial reproduction C/N was measured, and moreover the samples thus prepared were subjected to durability test as described below and change in bit error rate (B.E.R.) of recorded information was examined.

Durability Test

Each disk sample was held vertically in a 70° C. and 85% RH thermo-hygrostat so that no excessive strain could be applied to the disk, and changes in B.E.R. after 500 hours, 1,000 hours and 2,000 hours were evaluated.

B.E.R. Evaluation

Signals (1 MHz) were recorded in each disk at 1,800 rpm in 4,000 tracks starting from a position of 30 mm in diameter using an optical disk tester OMS-1000 produced by Nakamichi Co., Ltd., and the signals were reproduced by irradiating 1.0 mW laser beam to measure initial bit error rate (B.E.R.), which was named $(BER)_0$. After durability test for t hours, recorded signals are reproduced to measure $(BER)_t$, and relative $$B.E.R. \frac{(BER)_t}{(BER)_0}$$

was obtained. If $$\frac{(BER)_{2000}}{(BER)_0} \leq 5.0,$$

the disk was judged to be acceptable.

It can be estimated that durability of 70° C.×85% RH 2000 hours corresponds to durability for no shorter than 10 years. A fluorescent X ray spectrometry was used for the analysis of composition. The results are shown in Table 1.

TABLE 1

| Sample No. | Structure of Recording Layer | Additional Element | Addition Amount (at. %) | Relative B.E.R.* After Aging at 70° C. × 85% RH | | | Initial Reproduction C/N dB |
|---|---|---|---|---|---|---|---|
| | | | | 500 Hr | 1,000 Hr | 2,000 Hr | |
| Example Sample 1 | Tb and Feco-addition superimposed | Pt | 9.5 | 1.0 | 1.0 | 1.0 | 46 |
| Example Sample 2 | Tb and Feco-addition superimposed | Pd | 9.5 | 1.0 | 1.0 | 2.0 | 45 |
| Example Sample 3 | Tb and Feco-addition superimposed | Au | 9.5 | 1.0 | 2.0 | 3.0 | 45 |
| Example Sample 4 | Tb and Feco-addition superimposed | Pt | 1.0 | 1.0 | 2.0 | 5.0 | 50 |
| Example Sample 5 | Tb and Feco-addition superimposed | Pt | 5.0 | 1.0 | 1.0 | 1.5 | 50 |
| Example Sample 6 | Tb and Feco-addition superimposed | Pd | 1.0 | 1.1 | 2.5 | 4.8 | 50 |
| Example Sample 7 | Tb and Feco-addition superimposed | Pd | 5.0 | 1.0 | 1.4 | 2.5 | 49 |
| Example Sample 8 | Tb and Feco-addition superimposed | Au | 1.0 | 1.2 | 3.0 | 5.0 | 50 |
| Example Sample 9 | Tb and Feco-addition superimposed | Au | 5.0 | 1.1 | 2.2 | 4.0 | 47 |
| Comp. Sample 1 | Uniformly added film | Ti | 9.5 | 1.0 | 2.0 | 5.0 | 47 |
| Comp. Sample 2 | Uniformly added film | Al | 9.5 | 2.0 | 3.0 | 10.0 | 46 |
| Comp. Sample 3 | Uniformly added film | Pt | 9.5 | 2.0 | 4.0 | 13.0 | 47 |
| Comp. Sample 4 | Uniformly added film | Pd | 9.5 | 5.0 | 10.0 | 21.0 | 47 |
| Comp. Sample 5 | Uniformly added film | Au | 9.5 | 7.0 | 15.0 | 30.0 | 46 |
| Comp. Sample 6 | Tb and Feco-addition superimposed | Ti | 9.5 | 2.0 | 17.0 | pitting corrosion occured | 46 |
| Comp. Sample 7 | Tb and Feco-addition superimposed | Al | 9.5 | 5.0 | 50.0 | pitting corrosion occured | 45 |
| Comp. Sample 8 | Tb and Feco-addition superimposed | Pt | 0.5 | 2.0 | 6.0 | 15.0 | 53 |
| Comp. Sample 9 | Tb and Feco-addition superimposed | Pt | 12.0 | 1.0 | 1.0 | 1.0 | 43 |
| Comp. Sample 10 | Tb and Feco-addition superimposed | Pt | 0.9 | 1.2 | 3.5 | 8.5 | 53 |
| Comp. Sample 11 | Tb and Feco-addition superimposed | Pd | 0.9 | 1.4 | 4.0 | 10.0 | 52 |
| Comp. Sample 12 | Tb and Feco-addition superimposed | Pd | 12.0 | 1.0 | 1.1 | 1.2 | 43 |
| Comp. Sample 13 | Tb and Feco-addition superimposed | Au | 0.9 | 1.6 | 6.0 | 12.0 | 52 |
| Comp. Sample 14 | Tb and Feco-addition superimposed | Au | 12.0 | 1.1 | 1.3 | 1.5 | 43 |
| Comp. Sample 15 | Uniformly added film | Pt | 5.0 | 4.0 | 8.0 | 18.0 | 48 |
| Comp. Sample 16 | Uniformly added film | Pd | 5.0 | 5.0 | 9.0 | 19.0 | 47 |
| Comp. Sample 17 | Uniformly added film | Au | 5.0 | 6.0 | 10.0 | 20.0 | 46 |
| Comp. Sample 18 | Tb-addition and Feco superimposed | Pt | 5.0 | 1.3 | 4.0 | 8.0 | 41 |
| Comp. Sample 19 | Tb-addition and Feco superimposed | Pd | 5.0 | 1.4 | 4.4 | 8.5 | 41 |
| Comp. Sample 20 | Tb-addition and Feco superimposed | Au | 5.0 | 1.2 | 3.0 | 6.5 | 44 |

TABLE 1-continued

| Sample No. | Structure of Recording Layer | Additional Element | Addition Amount (at. %) | Relative B.E.R.* After Aging at 70° C. × 85% RH | | | Initial Reproduction C/N dB |
|---|---|---|---|---|---|---|---|
| | | | | 500 Hr | 1,000 Hr | 2,000 Hr | |
| Comp. Sample 21 | Tb-addition and FeCo-addition superimposed | Pt | 5.0 | 1.1 | 2.5 | 6.0 | 44 |
| Comp. Sample 22 | Tb-addition and FeCo-addition superimposed | Pd | 5.0 | 1.1 | 2.8 | 6.2 | 44 |
| Comp. Sample 23 | Tb-addition and FeCo-addition superimposed | Au | 5.0 | 1.2 | 3.0 | 6.5 | 43 |

*A relative value where an initial value is 1.

Table 1 above shows the results of measurement on each sample. From comparison of Example Samples 1 to 3 with Comparative Samples 1 to 5, it is apparent that in the magneto-optical recording medium of the invention increase in bit error after aging is much less than in the conventional recording medium. In particular, comparison with the Comparative Samples 3 to 5 reveals that even if the same element is used as the additional element, remarkable improvement can be obtained by adding Pt, Pd or Au centered near FeCo as in the present invention. While Comparative Samples 6 and 7 show that no improving effect can be obtained when adding Ti or Al in the same manner as in the present invention.

Next, influence of the amount of the additional element was examined. The addition amount can be controlled by controlling the area of the metal chip mounted on FeCo target. Optical disks were prepared in the same manner as Example Sample 1 except that the amount of Pt was changed to 1.0, and 5.0 at. %. The disks obtained were named Example Samples 4 and 5, respectively. Furthermore, optical disks were prepared in the same manner as Example Sample 2 and 3 except that the amount of Pd or Au was changed to 1.0, and 5.0 at. %, respectively. The disks obtained were named Example Samples 6, 7, 8, and 9, respectively. While the disks containing 0.5, 12.0 and 0.9 at. % Pt in the Tb layer, 0.9 and 12.0 at.% Pd in the Tb layer and 0.9 and 12.0 at. % Au in the Tb layer were prepared and these optical disks were named Comparative Samples 8, 9, 10, 11, 12, 13, and 14. Results of measurements on these Example Samples and Comparative Samples are shown in Table 1 above. If the amount of Pt, Pd or Au is smaller than 10 at .%, protective effect is insufficient, and the amount of Pt, Pd or Au exceeding 10% deteriorates initial C/N (carrier to noise ratio) characteristics. Therefore, the amount of Pt, Pd or Au to be added is required to be within the range from 10 to 10.0 at .%.

Furthermore, influence of the recording layer to which Pt, Pd or Au is added was examined. A TbFeCo alloy target with a Pt, Pd or Au chip was used to prepare optical disks comprising uniform recording layer of TbFeCo including 5.0 at. % Pd, 5.0 at. % Pd or 5.0 at .%. Au, these optical disks were named Comparative Samples 15, 16 and 17, respectively. Also, optical disks comprising alternately superimposed layers of Tb including 5.0 at .% Pt and FeCo, alternately superimposed layers of Tb including 5.0 at. % Pd and FeCo and alternately superimposed layers of Tb including 5.0 at. % Au and FeCo, respectively and optical disks comprising alternately superimposed layers of Tb including 2.5 at. % Pt and FeCo including 2.5 at. % Pt, superimposed layers of Tb including 2.5 at. % Pd and FeCo including 2.5 at. % Pd and superimposed layers of Tb including 2.5 at. % Au and FeCo including 2.5 at. % Au, respectively, these optical disks were named Comparative Samples 18, 19, 20, 21, 22 and 23, respectively. Total amounts of the additional elements in the Comparative Samples 21, 22 and 23 were 5.0 at. %. Relative B.E.R. after aging and initial reproduction C/N of these Comparative Samples were measured and the results are also shown in Table 1. In the case that Pt, Pd or Au was added in the uniform TbFeCo recording layer, Comparative Samples 15 to 17, the prevention of the pitting corrosion is insufficient because the deterioration due to oxidation of Tb occurs and propagates before the occurrence of the condensation effect of Pt, Pd or Au, so that the relative B.E.R. after aging increases. When Pt, Pd or Au is added in Tb layer, Comparative Samples 18 to 20, perpendicular magnetic anisotropy decreases, so that initial reproduction C/N decreases, and furthermore since Pt, Pd or Au exists only in the vicinity of Tb, the effect on inhibition of the occurrence of pitting corrosion is small and as a result the durability characteristics are inferior. In the case that Pt, Pd or Au is added in both Tb layer and FeCo layer, Comparative Samples 21 to 23, since the noble metal is dispersed in the whole recording layer, it is difficult to improve both initial reproduction C/N and B.E.R., that is, since the additional element tends to deteriorate perpendicular magnetic anisotropy, initial reproduction C/N is relatively low and moreover, the relative B.E.R. after aging is higher than Example Samples.

Example 2

Optical disks were prepared in the same manner as Example Sample 1 except that the thicknesses of unit Tb layer and of unit FeCo-Pt layer were changed by controlling power applied to the Tb target and FeCo-Pt target and the speed at which the substrates revolved. The optical disks obtained were named Example Samples 10 to 14. On this occasion, Pt was added in an amount of 6 at. % for each sample. For each sample, signals of 2 MHz were recorded starting from a position of 30 mm in diameter and initial reproduction C/N and C/N after aging in a thermohygrostat at 70° C.×85 fi RH for 2,000 hours were measured, and change in C/N was examined. Results obtained are shown in Table 2., in which the thicknesses of layers are shown taking the thickness of unit atomic layer as 3.5Å for Tb layer and as 2.5Å for FeCo-Pt layer.

TABLE 2

| Sample No. | Thickness of Layer Tb (Atomic Layer) | FeCo-Pt (Atomic Layer) | B.E.R. Change after 75° C., 85% RH, 2,000 Hr | Initial C/N |
| --- | --- | --- | --- | --- |
| Example Sample 10 | 0.5 | 1.0 | 5.0 | 45 dB |
| Example Sample 11 | 1.0 | 2.0 | 1.5 | 49 dB |
| Example Sample 12 | 2.0 | 4.0 | 1.9 | 45 dB |
| Example Sample 13 | 0.3 | 0.6 | 9.0 | 45 dB |
| Example Sample 14 | 2.5 | 5.2 | 2.0 | 42 dB |

From the results shown in Table 2, it can be seen that the thickness of Tb layer is suitably 0.5 to 2 atomic layers. If it is less than 0.5, the durability is insufficient and if it exceeds 2.0, magnetic interaction between Tb and FeCo is insufficient and initial C/N is deteriorated.

Therefore, the thickness of FeCoPt layer is suitably 1 to 4 atomic layers taking the composition of Tb-Fe-Co alloy into consideration. This is also apparent from Table 2.

The number of repeated layers must be 20 to 300. If this number is less than 20, no sufficient C/N can be obtained while recording sensitivity decreases if this number is more than 300.

The situation is the same as Pt as for Pd and Au.

Example 3

A FeCoPt alloy target was used in place of the target 2 shown in FIG. 1. Pt content was varied as 9.5, 5.0 and 1.0 at. % and optical disks were prepared in the same manner as Example Samples 1, 5 and 4 and these optical disks were named Example Samples 15, 16 and 17, respectively. Relative B.E.R. and initial reproduction C/N of Example Samples 15, 16 and 17 were same as those of Example Samples 1, 5 and 4. In the same manner, by using a FeCoPd alloy target containing 9.5, 5.0 and 1.0 at. % Pd and by using a FeOoAu alloy target containing 9.5, 5.0 and 1.0 at. % Au, Example Samples 18, 19, 20, 21, 22 and 23 were prepared. Relative B.E.R. and initial reproduction C/N of Example Samples 18, 19, 20, 21, 22 and 23 were same as those of Example Samples 2, 7, 6, 3, 9 and 8, respectively.

In the above-described Example Samples, Tb was used as the rare-earth metal. However, the rare-earth element layer which is superimposed alternately with FeCo-Pt layer, FeCo-Pd layer or FeCo-Au layer may be composed of Nd, Dy or Gd. Alternatively, two or more rare-earth element may be used together. Two or more of Pt, Pd and Au may be added to the FeCo layer. Further, the Fe/Co ratio of FeCo layer which can be used in the present invention may be within the range which is usually used in magneto-optical recording layer, i.e., $0.5 \leq X \leq 1.0$ when the composition of the layer is expressed by $Fe_xCo_{1-x}$.

It is obvious to one skilled in the art that the present invention can be applied not only to bonded type but also to single plate type magneto-optical recording medium.

As explained above, according to the present invention, Pt, Pd or Au as additional element exists as localized near FeCo and therefore these additional elements protect the transient metals very effectively, resulting in that the optical disk prepared is endowed with a high reliability.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A magneto-optical recording medium comprising:
    a transparent substrate; and
    a recording layer formed on said substrate;
    wherein said recording layer is a multi-layered metallic thin film comprising a first unit layer composed of $(Fe_xCo_{1-x})_{1-y}M_y$ where M is Pt, Pd or Au, $0.5 \leq X \leq 1.0$, and $0.01 \leq y \leq 0.1$, and a second unit layer of Nd, Dy, Gd or Tb, and said first unit layer and said second unit layer being superimposed alternately one on another.

2. The magneto-optical recording medium as claimed in claim 1, wherein said first unit layer has a thickness of 1 to 4 atomic layers and said second unit layer has a thickness of 0.5 to 2 atomic layers, and wherein respective 20 to 300 layers of said first and second unit layers are superimposed alternately one on another.

3. The magneto-optical recording medium as claimed in claim 1, further comprising a dielectric thin film formed between said substrate and said recording layer.

4. The magneto-optical recording medium as claimed in claim 3, further comprising another dielectric thin film formed on said recording layer.

5. A magneto-optical recording medium comprising:
    a first recording medium including:
        a first transparent substrate;
        a first lower dielectric layer formed on said first transparent substrate;
        a first recording layer composed of a multi-layered metallic thin film formed on said first lower dielectric layer and including a first unit layer composed of $(Fe_xCo_{1-x})_{1-y}M_y$ where M represents Pt, Pd or Au, $0.5 \leq X \leq 1.0$, and $0.01 \leq y \leq 0.1$, and a second unit layer composed of Nd, Dy, Gd or Tb, and said first unit layer and said second unit layer being superimposed alternately one on another;
        a first upper dielectric layer formed on said first recording layer; and
        a first protective layer formed on said first upper dielectric layer; and
    a second recording medium including:
        a second transparent substrate;
        a second lower dielectric layer formed on said second transparent substrate;
        a second recording layer composed of a multi-layered metallic thin film formed on said second lower dielectric layer and including a third unit layer composed of $(Fe_xCo_{1-x})_{1-y}M_y$ where M represents at least Pt, Pd or An, $0.5 \leq X \leq 1.0$, and $0.01 \leq y \leq 0.1$, and a fourth unit layer of Nd, Dy, Gd or Tb, and said third unit layer and said forth unit layer being superimposed alternately one on another;
        a second upper dielectric layer formed on said second recording layer; and
        a second protective layer formed on said second upper dielectric layer;

said first and second recording media being bonded to each other in such a manner that said first and second protective layers face one another.

6. A magneto-optical recording medium comprising:
a transparent substrate;
a recording layer formed on said substrate;
a dielectric thin film formed between said substrate and said recording layer; and
another dielectric thin film formed on said recording layer;
wherein said recording layer is a multi-layered metallic thin film comprising a first unit layer composed of $(Fe_xCo_{1-x})_{1-y}M_y$ wherein M is Pt, Pd or Au, $0.5 \leq X \leq 1.0$, and $0.01 \leq y \leq 0.1$, and having a thickness of 1 to 4 atomic layers and a second unit layer of Nd, Dy, Gd or Tb, and having a thickness of 0.5 to 2 atomic layers, and wherein 20 to 300 layers of said first and second unit layers are superimposed alternately one on another.

7. A method for producing a magneto-optical recording medium comprising the step of:
sputtering a first target made of Tb and a second target consisting essentially of FeCo and Pt, Pd or Au, thereby forming on the substrate a multi-layered recording layer comprising a first unit layer composed of $(Fe_xCo_{1-x})_{1-y}M_y$ wherein M is Pt, Pd or Au, $0.5 \leq X \leq 1.0$, and $0.01 \leq y \leq 0.1$, and having a thickness of 1 to 4 atomic layers and a second unit layer composed of Nd, Dy, Gd or Tb, and having a thickness of 0.5 to 2 atomic layers.

8. The method as claimed in claim 7, wherein said substrate is revolved so that said substrate confronts said first target and said second target alternately.

9. The method as claimed in claim 8, further comprises the step of stopping the revolving motion of the substrate during a time when the substrate is positioned at a position that the substrate confronts any one of the first target and the second target.

10. The method as claimed in claim 9, further comprises the step of opening a shutter provided on a surface of the substrate in synchronization with the stopping of the revolving motion of the substrate.

11. The method as claimed in claim 7, wherein 20 to 300 layers of said first and second unit layers are superimposed alternately one on another.

12. The method as claimed in claim 7, wherein said second target is made of a FeCoPt alloy, FeCoPd alloy or FeCoAu alloy.

13. The method as claimed in claim 7, wherein said second target is made of a FeCo alloy and a chip of at least one metal Pt, Pd or Au is mounted on the second target.

* * * * *

UNITED STATES PATENT AND TRADEMARK OFFICE
CERTIFICATE OF CORRECTION

PATENT NO. : 5,441,804
DATED : August 15, 1995
INVENTOR(S) : Toshiyuki Aritake et al.

It is certified that error appears in the above-indentified patent and that said Letters Patent is hereby corrected as shown below:

On the title page, item [75], "Akitake" should read --Aritake--.

Abstract, Line 8, "a%" should read "at".

Claim 5, Column 12, Line 60, delete "at least", and "An" should read --Au--.

Signed and Sealed this

Seventeenth Day of September, 1996

Attest:

BRUCE LEHMAN

Attesting Officer     Commissioner of Patents and Trademarks